TERMINALLESS CONNECTIONS FOR WIRE LEADS

Filed Oct. 5, 1964

INVENTOR.
DAVID J. CRIMMINS
BY
Kenyon & Kenyon
ATTORNEYS

United States Patent Office 3,327,284

Patented June 20, 1967

3,327,284

TERMINALLESS CONNECTIONS FOR WIRE LEADS

David J. Crimmins, Pennington, N.J., assignor to The Thomas & Betts Company, Incorporated, Elizabeth, N.J., a corporation of New Jersey Filed Oct. 5, 1964, Ser. No. 401,394
4 Claims. (Cl. 339—276)

This invention relates to a new and improved terminalless connection for wire leads and more particularly to a new and improved terminalless connection for wire leads which may be easily inserted into a printed circuit board or the like, and which provides secure attachment of the wire lead to the printed circuit board during the soldering operation.

In many applications, it is necessary to insert a wire lead into a board, receptacle, or the like in order to retain it in a stable position for soldering or the like. In particular, it is desirable to hold wire leads stable during the soldering of such leads to a printed circuit board.

In recent years, printed circuitry has become widely used in the electronics industry. In the formation of printed circuit boards, a pattern of electrical conductors is formed on the surface of a rigid insulating board by means of various techniques, such as electro-plating, photo-etching or the like. After the electrical conductor pattern has been formed on the insulator board, holes are drilled in the board to facilitate attachment to the board of various electrical components such as transistors, resistors, capacitors, or the like. These various electrical components have wire leads which are inserted into holes in the printed circuit board. After assembly of the desired electrical components with the printed circuit board, the wire leads are soldered to the conductor pattern on the board by dipping the undersurface of the board into liquid solder.

It has been found that merely inserting the wire leads of the electrical components into the holes in the printed circuit board is insufficient to maintain the electrical components in the board with sufficient stability before and during the soldering operation. In order to provide for fixed attachment of an electrical component to a printed circuit board, various connections have been devised for placement on the wire leads of the electrical component. These connections are so formed that when the lead is inserted in a hole in the circuit board, the lead is rigidly held in the board. Thus, a lead may be properly positioned with respect to the conductor pattern on the board so that a proper electrical connection may be made during the soldering operation. These connections are disadvantageous in that a separate step of attaching the connection to an individual wire lead is required.

In order to overcome the disadvantages of these separate connectors, the present invention has been developed. According to the present invention, the wire lead of an electrical component or electrical conductor is first bent back upon itself and then cold swaged into a wedge shape. This wedge shape provides for easy insertion of the wire lead into a hole on the circuit board while providing rigid attachment of the lead to the board. The tapered wedge also encompasses wide tolerances in hole diameters. In addition, the wedge-shaped tip on the wire lead may be quickly and easily formed.

It is an object of this invention to provide a new and improved terminalless connection for wire leads to be inserted in boards or the like that is simple and easy to manufacture.

It is another object of this invention to provide a new and improved terminalless connection for wire leads to be inserted in printed circuit boards that is simple and economical to manufacture.

It is a further object of the present invention to provide a new and improved terminalless connection for wire leads to be inserted in printed circuit boards that provides rigid attachment of an electrical component to the board during the soldering operation.

It is still another object of the present invention to provide a new and improved method for making terminalless connections for wire leads.

Other and further objects will be readily apparent to those skilled in the art from the following description and drawings wherein.

Figures 1, 2:
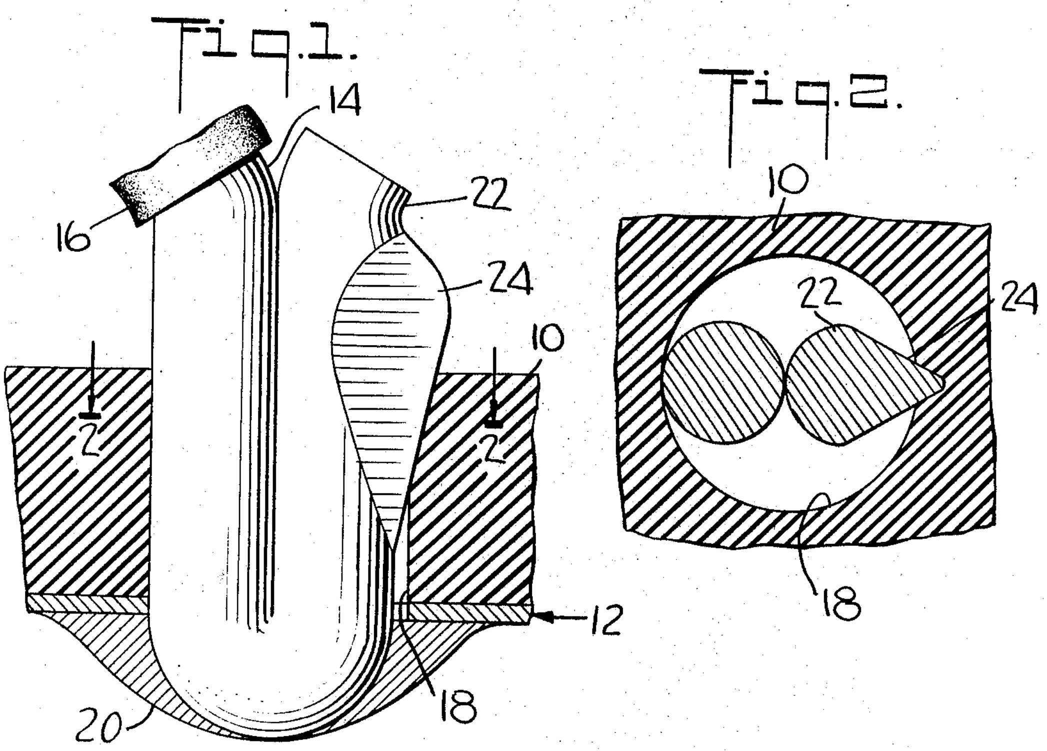
FIG. 1 is a partially sectional elevational view of one embodiment of the present invention.
FIG. 2 is a partially sectional plan view taken along line 2—2 of FIG. 1.

Referring now to the drawings, FIG. 1 shows an insulated printed circuit board 10 having a conductor pattern 12 formed on the undersurface thereof. A solid wire lead 14 having insulation 16 is shown inserted within hole 18 of board 10. Solder 20 provides a secure electrical connection between lead 14 and conductor pattern 12. As shown, lead 14 is bent back upon itself in the shape of a U. Leg 22 of bent lead 14 has been cold swaged such as to form a wedge-shaped portion 24 thereon. Wedge-shaped portion 24 is shown in FIG. 1 as protruding beyond the periphery of lead 14. The height of this protrusion increases gradually in order that lead 14 may be easily inserted within hole 18 in board 10 and wedged therein. As shown in FIG. 2, the circular cross-section of segment 22 has been distorted by cold swaging into a semi-circular triangular cross-sectional shape.

Figures 3, 4:
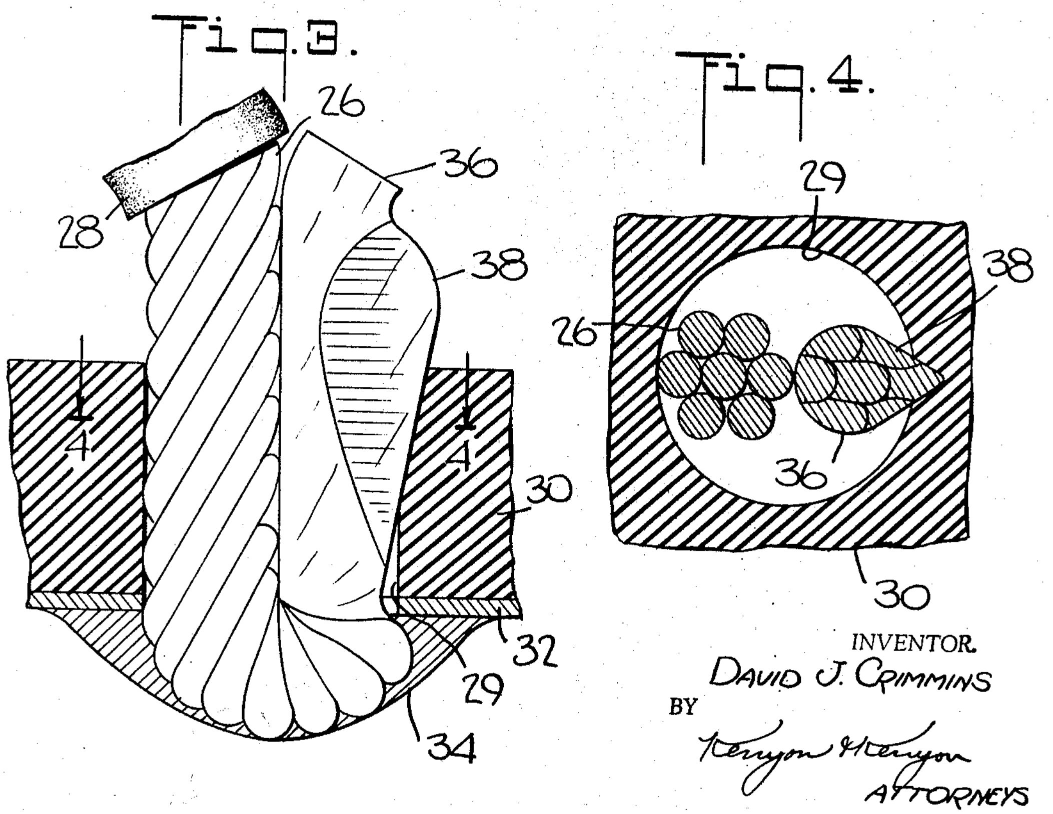
FIG. 3 is a partially sectional elevational view of another embodiment of the present invention.
FIG. 4 is a partially sectional plan view taken along line 4—4 of FIG. 3.

Referring now to FIGS. 3 and 4, there is shown the terminalless connection of the present invention as applied to a multi-stranded insulated wire lead. As shown, wire lead 26 having insulation 28 is bent back upon itself in the shape of a U and is inserted into hole 29 of printed circuit board 30 having a conductor pattern 32 formed on the undersurface thereof. Solder 34 provides a secure electrical connection between lead 26 and conductor pattern 32. In order to provide a better electrical connection, it is preferable that wire lead 26 be tinned.

Leg 36 of bent lead 26 has a wedge-shaped raised portion 38 adapted to provide easy insertion of lead 26 into board 30 and to provide secure positioning of the lead during the soldering operation. Wedge-shaped portion 38 is formed by cold swaging. As shown more clearly in FIG. 4, the swaging of segment 36 of multistranded lead 26 tends to compress the individual strands into a more or less solidified mass.

According to the method of the present invention a wire lead is first bent back upon itself in the shape of a U and the thus bent-back portion is cold swaged or the like to form a wedge-shaped protrusion on at least one of the legs of the bent lead. Cold swaging may be accomplished either manually by means of a hand tool or mechanically by means of a suitable machine. It is evident that the step of bending the wire may also be accomplished by any suitable apparatus and may even be done by hand.

Although the terminalless connection for wire leads has been described hereinabove with particular reference to use with printed circuit boards, it will be apparent that such a connection may be readily used in other applications where such a connection may be desirable.

It will be understood that although a specific form of terminalless connection has been described hereinabove and has been shown in the drawings, other shapes and forms may be used within the scope of this invention. Thus, instead of forming only one wedge-shaped protrusion on the bent wire lead, two or more wedge-shaped portions could also be formed. In addition, the bent lead may also be cold swaged to form a more or less conically-shaped end portion having sides which taper down toward the free end of the lead. In such cases, it will be understood that the cold swaging step of the method of the present invention would be suitably adapted to produce the desired form of the connection.

It will also be understood that although preferred embodiments have been described hereinabove and shown in the drawings, other embodiments will be readily apparent to those skilled in the art that are within the scope of the present invention. The scope of the present invention, therefore, is not to be limited by the above description and drawings, but rather by the appended claims.

What is claimed is:

1. A terminalless connection for wire leads comprising a free end portion of a wire lead bent back upon itself in the shape of a U to form thereby a pair of legs having a bent portion therebetween, at least one of said legs of said U-shaped free end portion having a wedge-shaped protrusion formed thereon, said wedge-shaped protrusion having a semi-circular triangular cross-sectional shape, the triangular cross-sectional portion of said protrusion extending beyond the periphery of said wire lead and tapering down towards the bent portion thereof, whereby said wire lead may be inserted, bent portion first, into a hole in a terminal board and thereby wedged therein.

2. A terminalless connection for wire leads comprising a free end portion of a wire lead bent back upon itself in the shape of a U to form thereby a pair of legs having a bent portion therebetween, at least one of the legs of said U-shaped free end portion having a wedge-shaped protrusion formed thereon, said protrusion having a cross-sectional shape wherein the sides thereof taper towards one another to form an end part, said end part extending beyond the periphery of said wire lead and tapering down towards the bent portion thereof and merging with said leg having said protrusion, such that said lead may be inserted, bent portion first, into a hole in a terminal board and thereby wedged therein.

3. A method of forming a terminalless connection for wire leads comprising the steps of bending the free end portion of a wire lead back upon itself and cold swaging said bent-back portion to form the cross-section of the wire lead into a substantially semi-circular triangular cross-sectional shape such that said triangular cross-section portion protrudes beyond the periphery of said wire lead at the widest portion thereof and tapers down towards the bent portion in order that said bent portion may be inserted into a hole in a terminal board and thereby wedged therein.

4. A method of forming a terminalless connection for wire leads comprising the steps of bending the free end portion of a wire lead back upon itself to form a pair of legs having a bent portion therebetween, and cold-swaging at least one of said legs to form a wedge-shaped protrusion having a cross-sectional shape wherein the sides taper substantially towards one another to form an end part, such that said end part extends beyond the periphery of said wire lead at the widest portion thereof and tapers down towards said bent portion and merges with said leg having said protrusions, in order that said bent portion may be inserted into a hole in a terminal board and thereby wedged therein.

References Cited

UNITED STATES PATENTS

| | | | |
|---|---|---|---|
| 930,674 | 8/1909 | Mead. | |
| 1,972,153 | 9/1934 | MacChesney | 24—29 |
| 2,007,311 | 7/1935 | Sherman | 85—30 |
| 2,179,609 | 11/1939 | Bidwell | 339—276 X |
| 3,008,119 | 11/1961 | Swengel | 339—276 |
| 3,008,221 | 11/1961 | Uebelmann | 339—276 X |

MARVIN A. CHAMPION, *Primary Examiner.*

EDWARD C. ALLEN, *Examiner.*

P. TEITELBAUM, *Assistant Examiner.*